(12) United States Patent
Pierrat et al.

(10) Patent No.: US 7,614,033 B2
(45) Date of Patent: *Nov. 3, 2009

(54) MASK DATA PREPARATION

(75) Inventors: Christophe Pierrat, Santa Clara, CA (US); Alfred Kwok-Kit Wong, Brookline, MA (US)

(73) Assignee: Takumi Technology Corp., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/442,110

(22) Filed: May 26, 2006

(65) Prior Publication Data

US 2006/0218520 A1 Sep. 28, 2006

(51) Int. Cl.
*G06F 17/50* (2006.01)

(52) U.S. Cl. .............................. 716/21; 716/7; 716/11; 716/19

(58) Field of Classification Search ................... 716/19, 716/21, 7–9, 11
See application file for complete search history.

(56) References Cited

U.S. PATENT DOCUMENTS

| | | | | |
|---|---|---|---|---|
| 4,475,037 A * | 10/1984 | Vettiger et al. | ............ | 250/252.1 |
| 5,121,256 A | 6/1992 | Corle et al. | | |
| 5,469,299 A | 11/1995 | Nagano | | |
| 5,553,274 A * | 9/1996 | Liebmann | ..................... | 716/21 |
| 5,982,558 A | 11/1999 | Further et al. | | |
| 6,081,658 A | 6/2000 | Rieger et al. | | |
| 6,198,576 B1 | 3/2001 | Matsuyama | | |
| 6,330,078 B1 * | 12/2001 | Wang | .......................... | 358/1.9 |
| 6,522,484 B1 | 2/2003 | Schuster | | |
| 6,760,640 B2 * | 7/2004 | Suttile et al. | ................. | 700/121 |
| 2004/0052411 A1 * | 3/2004 | Qian et al. | ................... | 382/144 |

OTHER PUBLICATIONS

French, Roger H., et al., "Fluoropolymers for 157nm Lithography: Optical Properties from VUV Absorbance and Ellipsometry Measurements," SPIE Proceedings, Microlithography 2000, 12 pages.

Flagello, Donis G., et al., "High-numerical-aperture eefects in photoresist," Applied Optics 36(34) (Dec. 1, 1997) 8944-8951.

(Continued)

*Primary Examiner*—Sun J Lin
(74) *Attorney, Agent, or Firm*—Hall Estill; William C. Milks, III

(57) ABSTRACT

The manufacturing of integrated circuits relies on the use of optical proximity correction (OPC) to correct the printing of the features on the wafer. The data is subsequently fractured to accommodate the format of existing mask writer. The complexity of the correction after OPC can create some issues for vector-scan e-beam mask writing tools as very small slivers are created when the data is converted to the mask write tool format. Moreover the number of shapes created after fracturing is quite large and are not related to some important characteristics of the layout like for example critical areas. A new technique is proposed where the order of the OPC and fracturing steps is reversed. The fracturing step is done first in order to guarantee that no slivers are created and that the number of shapes is minimized. The shapes created can also follow the edges of critical zones so that critical and non-critical edges can be differentiated during the subsequent OPC step.

24 Claims, 7 Drawing Sheets

OTHER PUBLICATIONS

French, Roger H., et al., "Materials Design and Development of Fluoropolymers for Use as Pellicles in 157nm Photolithography," Optical Microlithography XIV, Proceedings of SPIE vol. 4346 (2001).

Pierrat, Christophe, et al., "The MEF Revisited: Low k1 Effects versus Mask Topography Effects," Optical Microlithography XVI, Proceedings of SPIE vol. 5040 (Feb. 25, 2003).

Chiba, Yuji, et al., "New generation projection optics for ArF lithography," Optical Microlithography XV, Proceedings of SPIE vol. 4691 (2002), 679-686.

Baek, So-Yeon, et al., "Simulation Study of Process Latitude for Liquid Immersion Lithography," Optical Microlithography XVI, Proceedings of SPIE vol. 5040 (Feb. 27, 2003), 11 pages.

Pendry, J.B., et al., "Near-field lenses in two dimensions," J. Phys.: Condens. Matter 14 (2002) 8463-8479.

Ober, Christopher K., "Polymer Surfaces and Surface Analysis," Nanobiotechnology MSE 563/AEP 663 (2000), 43 pages.

Hafeman, Scott, et al., "Simulation of imaging and stray light effects in immersion lithography," Optical Microlithography XVI, Proceedings of SPIE vol. 5040 (Feb 27, 2003), 13 pages.

Brunner Timothy A., et al., "Optical/Laser Microlithography VIII," SPIE, vol. 2440, 301-312, (1995).

Garofalo, J., et al., "Automatic Proximity Correction for 0.35Fm I-Line Photolithography," IEEE, Numerical Modeling of Processes and Devices for Integrated Circuits, 1994. NUPAD V., International Workshop on Jun. 5-6, 1994, 92-94.

Rieger, Michael L., et al., "Using Behavior Modelling for Proximity Correction," SPIE, 1994, 6 pages.

Stirniman, John P., et al., "Fast Proximity Correction with Zone Sampling," SPIE, vol. 2197, 294-390, (1994).

Stirniman, John P., et al., "Optimizing Proximity Correction for Wafer Fabrication Processes," SPIE, vol. 2322, Photomask Technology and Management (1994) 239-246.

Liebmann, L.W. et al., "TCAD development for lithography resolution enhancement," IBM J. Res. & Dev. vol. 45, No. 5, Sep. 2001, 651-665.

Torres, J.A., et al., "Contrast-Based Assist Feature Optimization," Deep Submicron Technical Publication, May 2002, Mentor Graphics, 8 pages.

* cited by examiner

MASK DATA PREPARATION

FIELD OF THE INVENTION

The invention relates to the process of fabricating semiconductor chips. More specifically, the invention relates to a method for preparing mask data.

RELATED ART

The high volume manufacturing of integrated circuits relies on the use of optical lithography to define the features printed on the semiconductor chips. The lithography process starts first by coating the surface of the semiconductor wafer with a material called resist. A source of radiation is then shone through the mask in the case of a transparent mask. For a reflective mask the radiation is reflected by the mask. The transparent mask is made of a substrate transparent to the radiation and coated with a patterned opaque layer defining clear and opaque regions to the radiation. Transparent masks are mostly used in optical lithography with typical wavelengths of 436 nm, 405 nm, 365 nm, 248 nm, 193 nm, and 157 nm. The reflective masks are made using a substrate reflective to the radiation and coated with a patterned non-reflective layer defining reflective and non-reflective regions to the radiation. Alternatively, a reflective mask could be made of a non-reflective substrate coated with a reflective layer. Reflective masks are mostly used for shorter radiation wavelength on the order of 13 nm usually referred to as EUV or Extreme Ultra Violet.

During the exposure to the radiation source, an image of the mask is formed using an optical system on top of the resist layer. Various optical systems can be used to produce an image of the mask. The main technique used today in volume production relies on the projection of the image of the mask onto the wafer. Typically the wafer image is reduced by a factor of 4 (usually named mask image magnification factor or wafer image demagnification factor) as compared to the mask image, thus relaxing the mask fabrication requirements. The field on the wafer corresponding to the image of the mask is exposed multiple times to cover the entire wafer. The entire field can be exposed in one shot, in this case the equipment is named a stepper.

Alternatively, the field can be scanned by moving the mask and the wafer relative to the projection lens. In this case the equipment is named a scanner. Scanners offer the advantage to mitigate some field non-uniformities observed in steppers but the scanning mechanism adds residual noise that partially degrades the aerial image. Moreover scanners show differences of the aerial image for features perpendicular to the scan direction versus features parallel to the scan direction.

The resist layer is exposed by the radiation passing through the mask in case of a transparent mask or reflected by the mask in the case of a reflective mask. The resist is then developed in a developer bath and depending on the polarity of the resist (positive or negative), the exposed regions or the unexposed regions of the resist are removed. The end result is a semiconductor wafer with a resist layer having a desired pattern. This resist pattern can then be used by subsequent processing steps of the underlying regions of the wafer.

As the feature size decreases, distortion in the pattern transfer process becomes more severe. The design shapes must be modified in order to print the desired images on the wafer. The modifications account for the limitation in the lithography process. One such modification is referred to as Optical Proximity Correction (OPC) in the case of optical lithography. In the case of OPC, modifications of the design image account for optical limitations as well as mask fabrication limitations and resist limitations. Modifications of the design image can also account for the subsequent process steps like dry etching or implantation. It can also account for flare in the optical system as well as pattern density variations. Another application of proximity effect correction is the compensation of the effects of aberrations of the optical system used to print the image of the mask onto the wafers. In this case, a mask with aberration correction would be dedicated to a given lithography tool as the aberrations are tool-specific.

FIG. 1 illustrates the modification of the mask data to correct for proximity effects. The processing of the mask data starts with a target layout 101 representing the desired dimensions of the image on the wafer. The printed image 102 of the target layout 101 differs from the desired image due to proximity effect. For reference, the target image 101 is shown with the printed image 102. The edges of the features are then moved (103) so that the corresponding printed image on the wafer 104 is correct (as close to the target as possible). In FIG. 1, all the areas of the layout have been corrected but different degrees of proximity effect correction aggressiveness can be applied to different regions depending on the criticality of the region in the integrated circuit.

The corrections to layout 101 can be applied using a rule-based approach or a model-based approach. For a rule-based approach (Rule-based OPC), the displacement of the segments would be set by a list of rules depending, for example, on the feature size and its environment. For a model-based approach (Model-based OPC), the printed image on the wafer would be simulated using a model of the pattern transfer process. The correction would be set such that the simulated image matches the desired wafer image. A combination of rule-based OPC and model-based OPC sometimes referred to as hybrid OPC can also be used.

In the case of model-based OPC, the original layout 201 as shown in FIG. 2 is dissected in smaller segments 203 shown in modified layout 202. Each segment is associated an evaluation point 204. The printed errors of the evaluation points are compensated by moving the corresponding segment in a direction perpendicular to the segment as shown in the final layout 205. The segments are corrected using multiple iterations in order to account for corrections of neighboring segments.

The image quality can be improved by adding printing or non-printing assist features along the edges of the main features. These assist features modify the diffraction spectrum of the pattern in a way that improves the printing of the main feature. The practical implementation of assist features is enhanced with the use of proximity effect correction as described above to correct for any optical printing artifact as well as resist and etch artifacts.

The image quality can also be improved by using phase-shifting masks. In this case, at least two different regions are created on the masks corresponding to different phase and transmission of the light either going through these regions (for transparent mask) or reflected by these regions (for reflective mask). The phase difference between the two regions is chosen to be substantially equal to 180 degrees. The destructive interference between adjacent regions of opposite phase creates a very sharp contrast at the boundary between the regions, thus leading to the printing of small features on the wafer. Two main classes of phase-shifting masks are in use today. For the first class, the amount of light transmitted for transparent masks (or reflected for reflective masks) by one region is only a portion of the light transmitted (or reflected) by the other region, typically 5% to 15%. These masks are referred to as attenuated phase-shifting masks or half-tone phase-shifting masks. In some implementation, regions opaque to the light source for transparent mask (with low reflection for reflective masks) are kept on the mask. These types of mask are referred to as tri-tone mask as they have for transparent masks, clear regions, opaque regions, and partially transparent regions (non-reflective, reflective, and partially reflective for reflective masks). For the second class, the light transmitted (for transparent masks) or reflected (for reflective masks) by one region is substantially equal to the light transmitted (for transparent masks) or reflected (for reflective masks) by the other region. The second class of masks includes the following types of phase-shifting masks: alternating aperture phase-shifting masks, chromeless phase-shifting masks, and rim phase-shifting masks. The practical implementation of these techniques is improved with the use of proximity effect correction as described above to correct for any optical printing artifact as well as resist and etch artifacts. All the techniques described in this paragraph can also be combined with the use of assist features.

The image quality can also be improved by using off-axis illumination. To achieve off-axis illumination, the illuminator of the stepper or scanner is shaped in a way that only the light at certain angles with respect to the optical axis is used to create the image thereby favoring certain spatial frequencies of the mask pattern. The off-axis setting can be adjusted for a given feature size and type or for a collection of feature sizes and types. Off-axis illumination can be used in combination with binary masks, attenuated phase-shifting masks, chromeless phase-shifting masks, or rim phase-shifting masks. Off-axis illumination will also be improved by the use of proximity effect correction as described in a previous paragraph. Off-axis illumination can also be combined with the use of assist-features.

The use of OPC to correct the printing of the features on the wafer has some important implications for mask making. As shown in FIG. 2, the data needed to write the mask (205) becomes much more complicated compared to the original data (201). Two main writing strategies are used today for mask manufacturing. For the first strategy named "raster-scan", an electron or optical beam is scanned on the mask and turned on where the mask should be exposed. For the second strategy named "vector-scan", a shaped e-beam is exposed at certain coordinates on the mask representing the data where the mask should be exposed. The shaped beam exposure tools usually require the data to only contain a certain set of angles. Typically these angles are 45 degree, 90 degree and 135 degree angles because of the restriction of the shapes that can be produced by the exposure tool. The complexity of the correction after OPC can create some issue for vector-scan e-beam mask writing tool as very small slivers are created when the data is converted to the mask write tool format as shown in FIG. 3. 301 represents the data before OPC, 302 the data after OPC, and 303 the data after fracturing. A sliver 304 was created during the fracturing of the data. These small slivers lead to exposure dose inaccuracies when the mask is exposed which in turn result in dimension inaccuracies.

Another issue during the fracturing step is the difficulty to predict the shapes of the polygons created as illustrated in FIG. 4. 401 represents the data before OPC, 402 the data after OPC and 403 the data after fracturing. The data 404 represents the same data as 401 rotated by 90 degree clockwise. The data 405 corresponds to the data 404 after OPC. It should be noted that the data 405 can be obtained by rotating by 90 degree clockwise the data 402. The data 406 corresponds to the data 405 after fracturing. In this case 406 cannot be obtained by rotating by 90 degree clockwise the data 403. The fracturing tool does not recognize the fact that the structures 402 and 405 are the same except for a 90-degree clockwise rotation and it creates two outputs 403 and 406 with different fracturing shapes. The difference in fracturing shapes will create some dosage difference between 403 and 406 when the photo-mask is exposed and it will result in dimension errors. This problem can be even more acute in critical areas of the layout. For example, 401 and 404 could represent a portion of a poly level and the dotted line 407 and 408 could represent the corresponding active area. The intersections between 401 and 407 (region 409), and 404 and 408 (region 410), represent the gate regions of the poly level whose dimensions are critical for ensuring the proper operation of the transistors. After fracturing (403 and 406), the regions corresponding to 409 and 410 have been decomposed differently thus creating dimensional difference on the mask because of the nature of the vector scan mask exposure tools.

What is needed is a method that prevents the creation of slivers during fracturing. Moreover this method should fracture the same way two same polygons placed with different rotation or mirroring.

SUMMARY

A method for performing proximity effect correction on a layout of an integrated circuit is described. The method consists of fragmenting the polygons of the layout into shapes based upon parameters of a manufacturing tool used for implementing the layout and then performing proximity effect correction on some of the segments of the shapes. The manufacturing tool can be a mask writer or more specifically a vector-scan, e-beam, mask writer. The fragmentation of the shapes can be such that no shape larger than the maximum allowable shape size is created after correction or no shape smaller than the minimum allowable shape size is created after correction.

This method can also be used to generate the data needed for various types of masks such as binary masks, attenuated phase-shifting masks, tri-tone phase-shifting masks, and alternating phase-shifting masks. In the case of alternating phase-shifting masks, two edges of a given shape may end up abutting two distinct phase-shifting regions and these two regions will need to be out of phase. This information can be stored and used later on when the phase assignment of the shifter regions is performed.

In some embodiments, the manufacturing tool is a mask inspection tool.

In other embodiments, some edges of the shapes are abutting the boundary of a critical area of the layout. The position of the boundary between the two shapes can also be adjusted to account for the position of the corrected edges of the shapes.

In some embodiments, polygons within proximity range of a first polygon are taken into account in the fragmentation of the shapes of the first polygon. To facilitate the fragmentation of the first polygon, corners of the polygons within proximity range can be used.

Embodiments of the invention include a photolithographic mask. The photolithographic mask comprises a layout pattern that has been corrected for proximity effects using the method described above.

Embodiments of the invention include a method for manufacturing integrated circuits. The method includes exposing a layer of material in an integrated circuit using a mask defined above. In some embodiments, the polarity of the resist used to define the features on the mask is chosen such that the critical regions of the layout correspond to exposed shapes.

Embodiments of the invention include a method for producing a photolithographic mask. The photolithographic mask is fabricated using a mask layout. The mask layout includes a layout pattern that has been corrected for proximity effects using the method described above.

Embodiments of the invention include a system for producing a layout. The system includes a data processor which executes programs of instruction and a memory accessible by the data processor to store programs of instruction. The programs of instruction include logic to receive the computer readable layout of a portion of the integrated circuit and to correct the layout using the correction method described above.

Embodiments of the invention include an article of manufacture, comprising a machine readable data storage medium storing programs of instruction. The programs of instruction include logic to receive a computer readable layout of a portion of the integrated circuit and to correct the layout using the correction method described above.

Another method for performing proximity effect correction on a layout is described. The method consists of fragmenting the edges of the polygons of the layout into segments based upon parameters of a manufacturing tool used for implementing the layout and then performing proximity effect correction on some of the segments. Embodiments of the invention include a method for manufacturing integrated circuits. The method includes exposing a layer of material in an integrated circuit using a mask having a mask layout based on the corrected layout described above. In some embodiments, the polarity of the resist used to define the features on the mask is chosen such that the critical regions of the layout correspond to exposed shapes.

DETAILED DESCRIPTION

Figure 1:
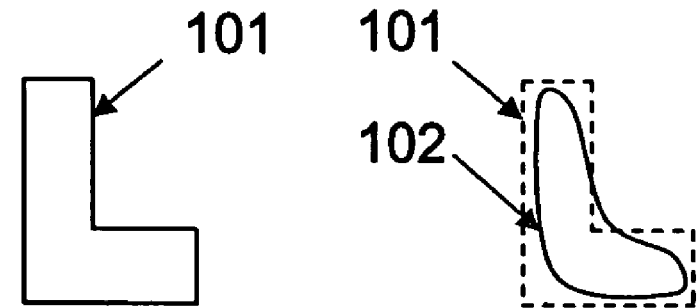
FIG. 1 illustrates the modification of the data to correct proximity effects.
Figure 1:
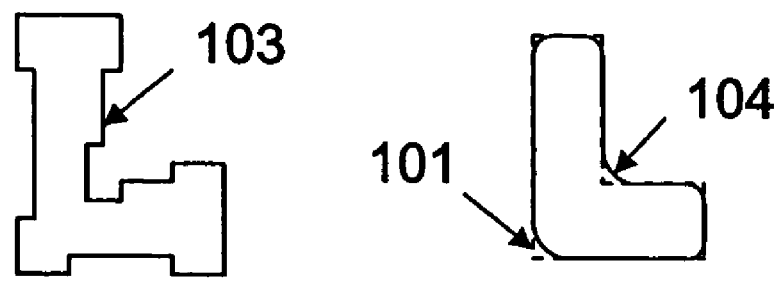
Figure 2:
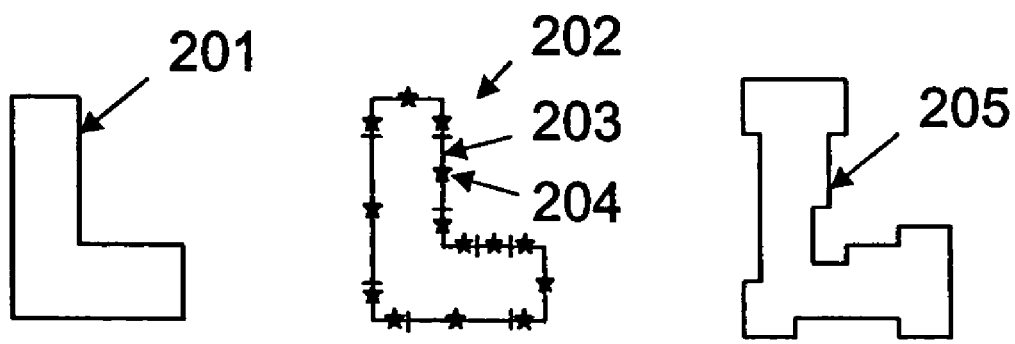
FIG. 2 illustrates the process flow used for model-based OPC.
Figure 3:
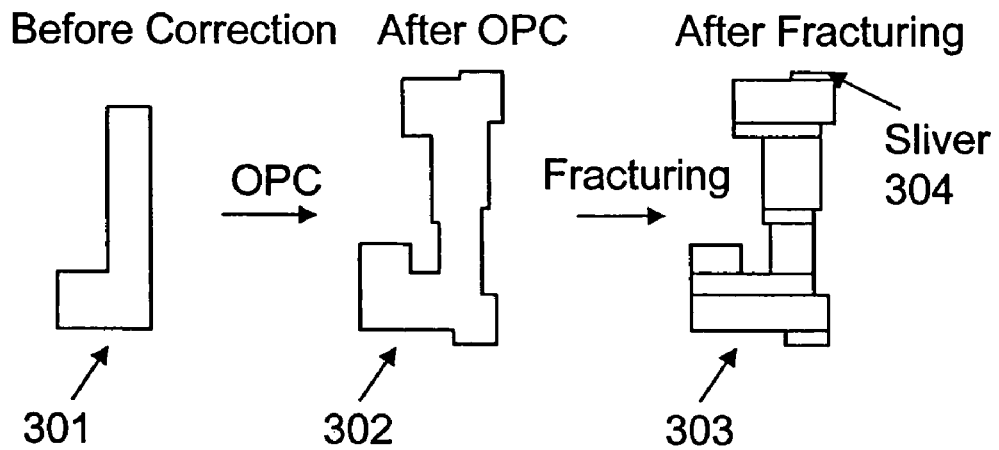
FIG. 3 illustrates the modification of the data to correct proximity effect and to fracture the polygons.
Figure 5:
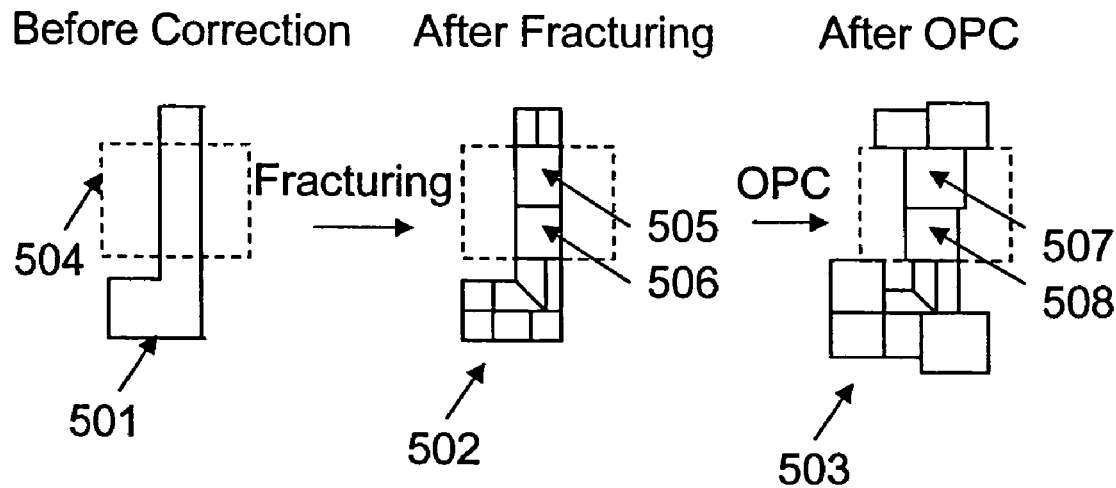
FIG. 5 depicts a new methodology where the polygons are fractured first and the OPC step is performed next.
Figure 6A:
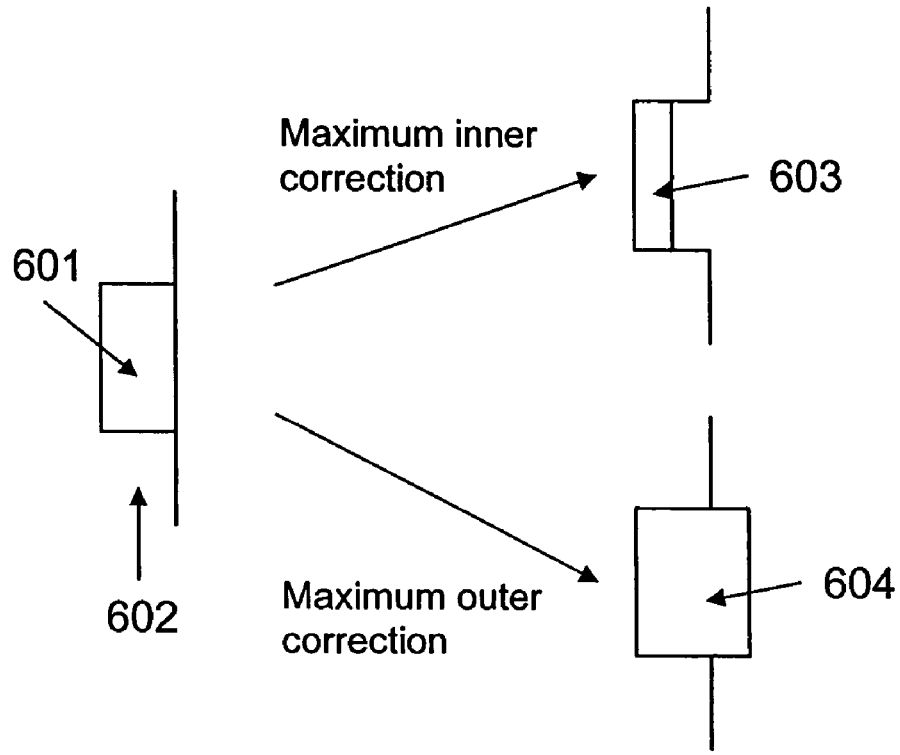
FIG. 6a describes the OPC effects of a maximum inner or outer correction on the shape dimensions.

A technique described in FIG. 5 was developed to address the issues encountered during the fracturing of data for vector-scan mask writer. The polygon 501 before correction is first fractured in smaller shapes 502. Some of the edges of the shapes are abutting the original polygon. During the OPC step, the shapes are modified into 503 and no sliver was created as shown in FIG. 5. Fracturing into shapes before OPC presents some important advantages. First, the shapes can be chosen such that even with the largest OPC correction, the shape will not turn into a shape difficult to manufacture for the vector-scan e-beam mask writer. In FIG. 6a, 601 represents a shape after fracturing which is a part of a larger polygon 602 (not completely drawn on the figure). During the OPC step, the shape 602 could receive a maximum inner correction or a maximum outer correction as described in FIG. 6a. 603 represents the shape after maximum inner correction and 604 represents the shape after maximum outer correction. The advantage of fracturing the shape before OPC as described earlier in FIG. 5 is that the dimensions of the shape 601 are chosen such that both cases 603 or 604 can be manufactured reliably using a vector-scan e-beam mask writer. The width of 603 is larger than the minimum width the vector-scan e-beam mask writer can print reliably, i.e. 603 is not a sliver as shown in FIG. 3. The width of 604 is smaller than the maximum width the vector-scan e-beam mask writer can print in one single shot, i.e. the shape does not need to be split into two shapes. The fracturing of the shapes can also be optimized for other manufacturing tools besides mask writers like for example mask inspection tools.

Figure 6B:
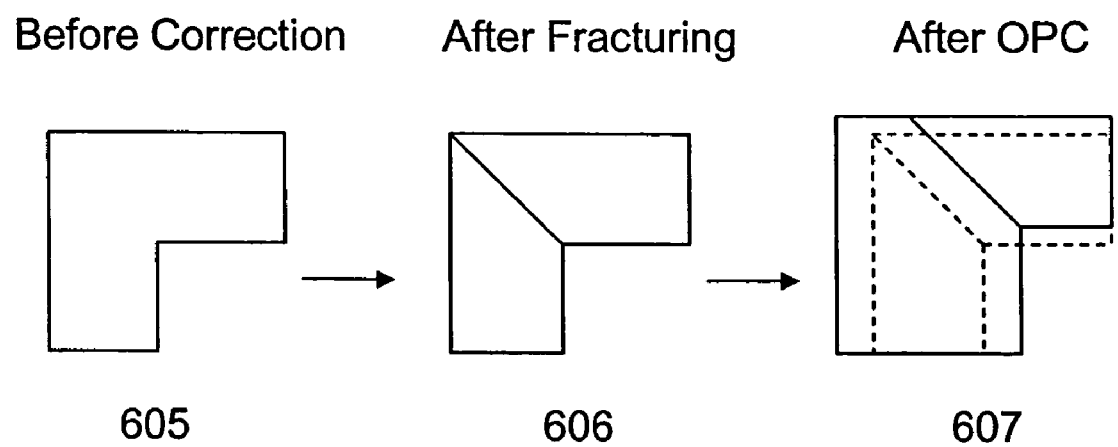
FIG. 6b describes the OPC effects on the stitching of the shapes.

The use of OPC after fracturing the polygons into shapes will also require the OPC tool to stitch the shapes after correction if needed. FIG. 6b shows an example or a corner polygon before correction 605, after fracturing 606, and after OPC 607. The shapes in dotted lines in 607 represent the shapes before OPC, the solid lines represent the shapes after OPC. Note that the original shape 605 was fractured in two shapes 606 containing a 45-degree angle which are valid shapes for the shaped-beam vector-scan mask writer. The advantage of the 45-degree angle in this case (i.e. elbow) is that it minimizes the number of shapes created and facilitates the OPC step. The 45-degree boundary between the two shapes was moved after correction to accommodate for the asymmetric OPC, i.e. the shapes have been stitched back together after OPC. Stitching the shapes is important for shaped-beam vector-scan mask writers as no void can be left between the shapes and no overlap is allowed between the shapes. A void would result in no exposure, an overlap would result in double exposure.

Figure 4:
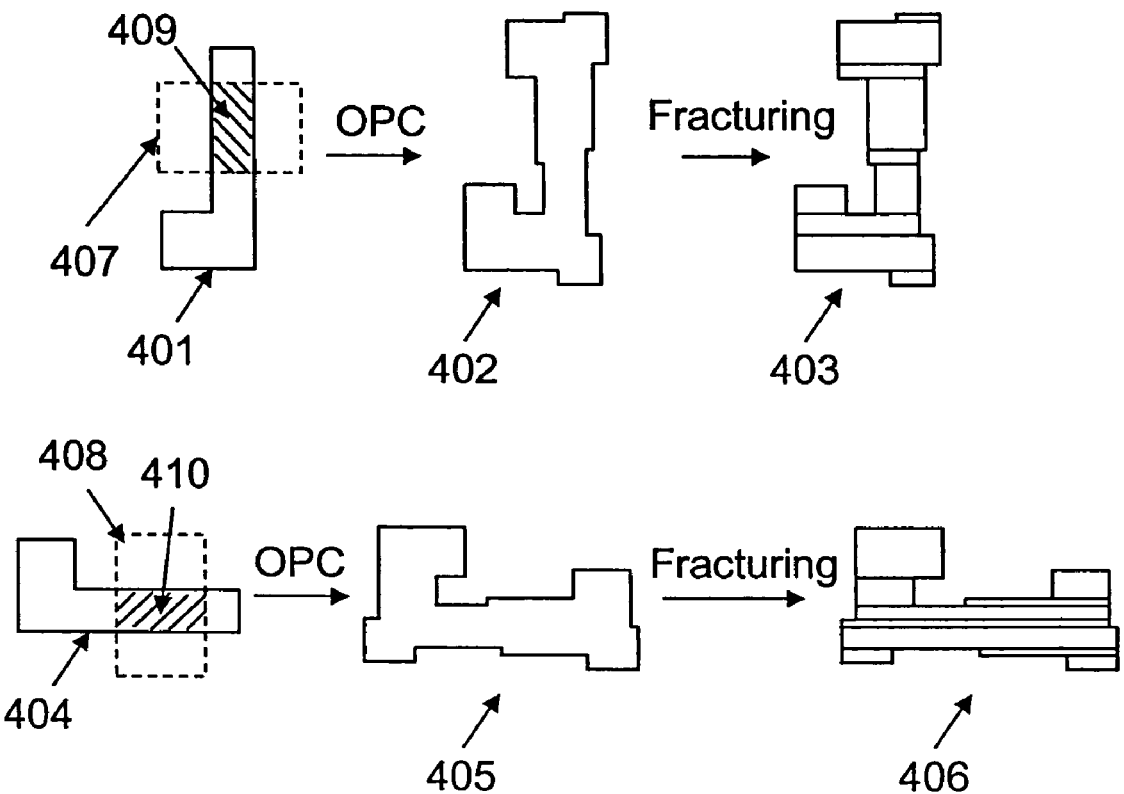
FIG. 4 compares the OPC and fracturing steps for a polygon oriented at 0 and 90 degrees.

Another advantage of fracturing before applying OPC is that the shapes can be chosen such that their edges will follow the edges of critical areas so that during the OPC step, the segments corresponding to critical areas can be corrected with tighter tolerances. For example in FIG. 5, 501 can represent a polygon part of the poly level and 504 represents the corresponding active area. The intersection between the polygons 501 and 504 is the gate region which is the critical area of the poly level as explained earlier in reference to FIG. 4. It should be noted that this critical area was fractured in exactly two shapes 505 and 506. Some of the edges of the shapes 505 and 506 are abutting the critical area. The two shapes 505 and 506 are converted respectively into the shapes 507 and 508 after OPC. As the shapes 505 and 506 correspond to critical areas of the layout, the tolerance on the correction of these shapes can be made tighter, for example, +/−1 nm maximum edge placement error after correction versus +/−3 nm maximum edge placement error for shapes corresponding to non-critical areas of the layout. Moreover, the number of shapes in the critical regions can be increased compared to non-critical regions in order to achieve a more accurate correction.

Figure 7:
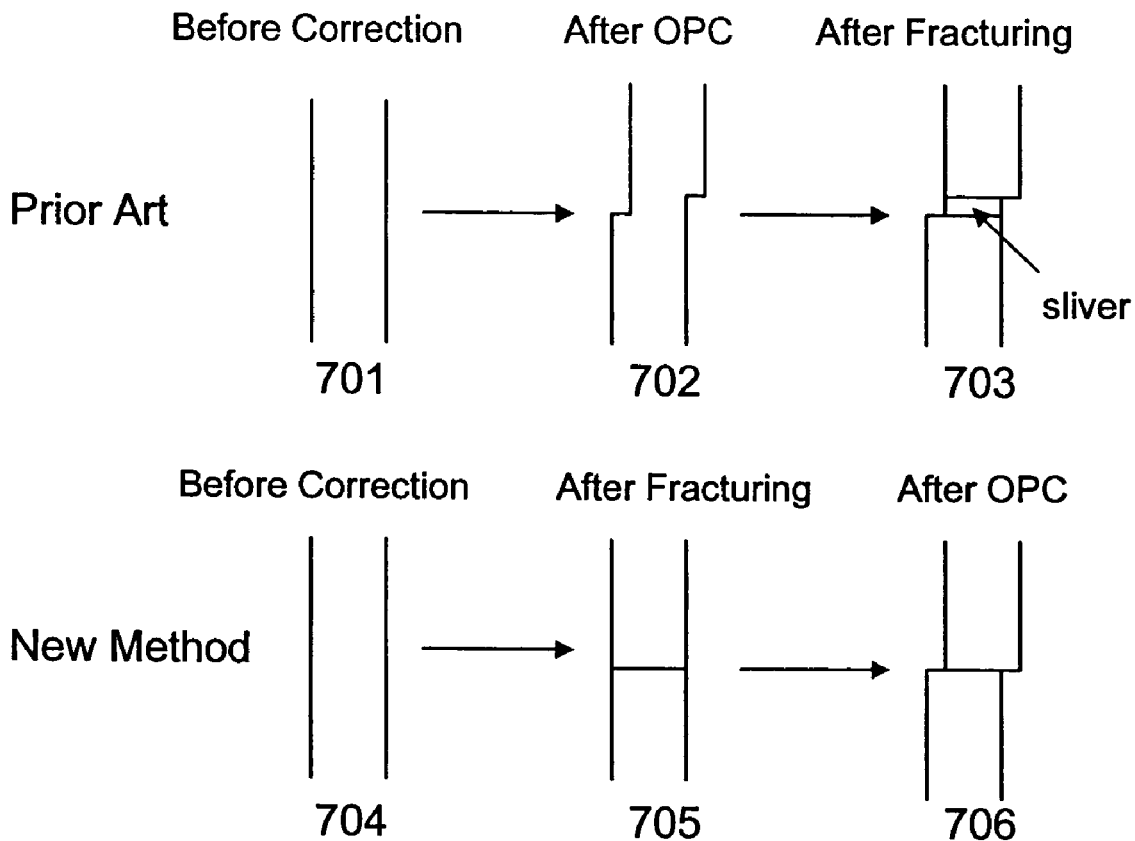
FIG. 7 illustrates the advantage of the invention in terms of preventing the creation of slivers and in terms of reducing the number of shapes created.

Another advantage of fracturing before applying OPC is that the shapes can be defined in a way to minimize the total count of shapes and to minimize the chance of creating slivers. FIG. 7 shows the example of a polygon 701 (only a portion of the polygon is represented). Using prior art OPC methodology, the polygon 701 is corrected into the polygon 702, which is then fractured into 703. As the edges of the features are independently segmented, any misalignment of the segmentation on the left edge with regard to the right edge can potentially create a sliver during subsequent fracturing as shown on 703. The new method described in this application solves the problem by creating fractured shapes before OPC. The original polygon 704 is fractured into the polygon 705 which is subsequently corrected into the polygon 706. The shapes defined in 705 prevent the issue described in 703. Moreover the total number of shapes can be decreased which in turn will decrease the time it takes to write the mask and the overall cost of manufacturing the mask.

Figure 8:
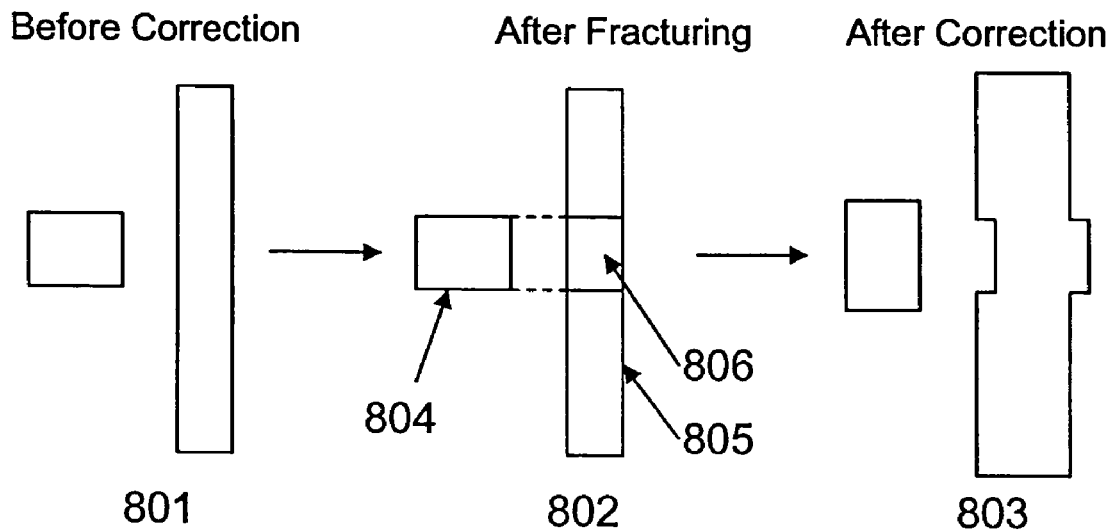
FIG. 8 illustrates the use of polygons in proximity range to define the fracturing of a given polygon.

Another important aspect of this invention is that the fracturing step can be tailored to the OPC step requirements. In FIG. 8, the layout 801 is fractured into the layout 802 and then turned into the layout 803 after OPC. Since the rectangle 804 is within proximity range of the rectangle 805, its presence will have an impact on the printing of the rectangle 805. Therefore, the corners of the rectangle 804 are used as a reference to create the shape 805 since it is likely that the correction along the edge of the rectangle 805 will be different in the proximity of the rectangle 804. The correction after OPC shows such a difference on the layout 803. If the shape 806 had not been created the correction between the polygons 804 and 805 would have been incorrect. The influence of a corner on an adjacent polygon can be translated into more than one dissection point on the polygon. For more accurate correction, multiple dissection points could be created. Rectangle 804 could belong to the same layer as rectangle 805 or it could belong to a different layer. For example 804 could belong to the active area layer and 805 could belong to the gate layer.

FIGS. 5, 6, 7, and 8 emphasize the need to combine OPC parameters and fracturing parameters. For example the segmentation performed during the OPC step need to be consistent with the segmentation done at fracturing. The usual flow of fracturing the data after performing OPC can also be improved if the OPC parameters are chosen in such a way that they do not create any issue with the subsequent fracturing step. The advantage of fracturing first (i.e. before the OPC step) is that the shapes are defined first and the creation of small slivers as described in FIG. 5 can be avoided by making sure that the shape dimension is compatible with the maximum OPC correction (described in FIG. 6a).

At the layout stage of an integrated circuit, the data is represented in a hierarchical fashion in order to minimize the amount of data needed to describe the circuitry. The hierarchical tree obtained is made of cells containing data and placement of other cells. To implement this technique hierarchical fracturing will be required. One of the hurdles to the implementation of hierarchical fracturing is the need for partitioning the layout into fields required by the vector-scan e-beam mask writers. At the boundaries of these fields, or for some mask writer in the vicinity of the boundaries, the polygons should be cut. Preferably, two placements of a cell in two different environments with a different fracturing boundary will have to be named differently since the fracturing result of the cell could be different.

Depending on the resist used to fabricate the mask, the layout data or a reverse-tone image of the layout data will be needed. If the layout data represents areas of the mask that should be dark, the layout data can be fractured directly to expose the mask with a negative-tone resist. On the other hand, the reverse-tone image of the layout data will be needed to expose the mask with a positive tone resist. If the layout data represents areas of the mask that should be clear (quartz), the layout data can be fractured directly to expose the mask with a positive-tone resist. On the other hand, the reverse-tone image of the layout data will be needed to expose the mask with a negative tone resist. The technique of this invention works for both cases. Preferably the resist polarity used to fabricate the mask will be chosen to minimize the volume of data, i.e. the number of shapes. For better dimension control, the resist polarity should be chosen in such a way that the critical dimensions of the layout are defined by exposed shapes. For example, in FIG. 5, a negative tone resist should be used to manufacture the mask to obtain a dark (chrome) 503 representation. If a positive tone resist were used the data volume would considerably increase (the complementary of data 503 would be exposed). Since the regions outside of data 503 are exposed, the size and dimensions of the shapes needed to expose the mask would depend on adjacent patterns. It would therefore be impossible to predict the shapes needed to create the critical gate regions thus creating possible dimensional control issue. On the other hand 507 and 508 clearly define the gate region for a negative-tone resist in this specific example thus ensuring a better control of the exposure of the gate region independently of its environment.

Figure 9:
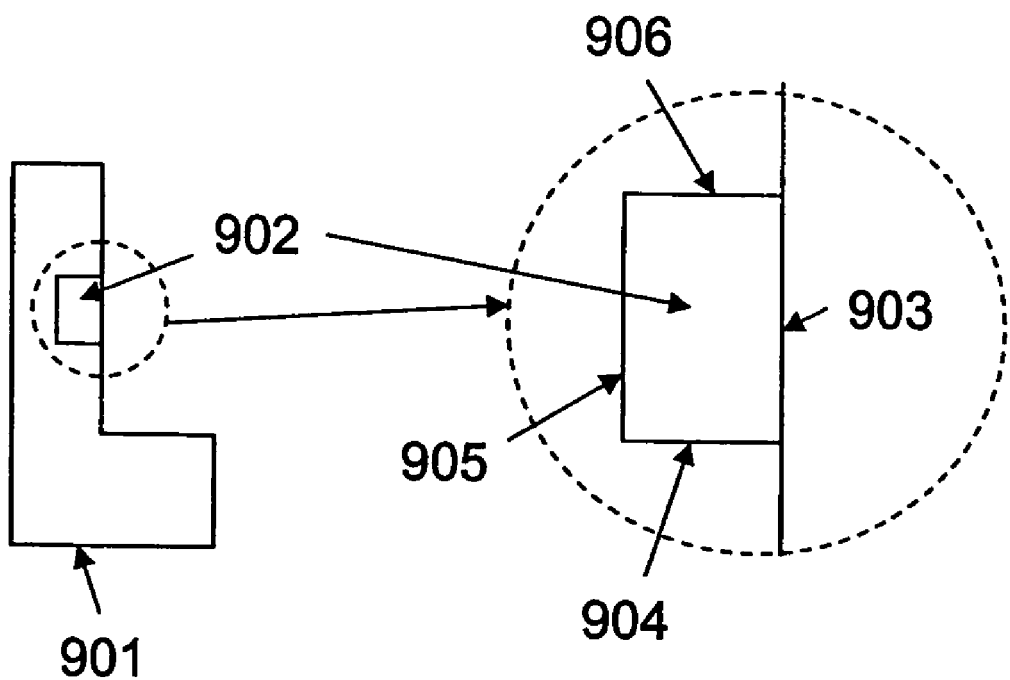
FIG. 9 illustrates the notion of shape and the associated edges.

The approach described in FIG. 5 emphasizes the need for a shape-based data processing engine. Shapes are created before any data processing is performed. FIG. 9 describes how the shapes can be used for subsequent processing steps. A shape 902 is shown in polygon 901. A magnified view of the shape is given on the right side of FIG. 9. The shape can be decomposed in two types of edges, edges that will create a printed edge on the wafer (903) and edges that will not create a printed edge on the wafer (904, 905, 906). All edges (903, 904, 905, 906) are important for the fracturing step as they are all required to define the shape. For OPC, only the edges creating printed edges on the wafer are important (903) as the position of the printed edge is being corrected to reflect the original layout. The data can also be verified to make sure that the printed edge is at the location defined in the original layout. In this case, only the edges creating printed edges on the wafer are important (903).

Figure 10:
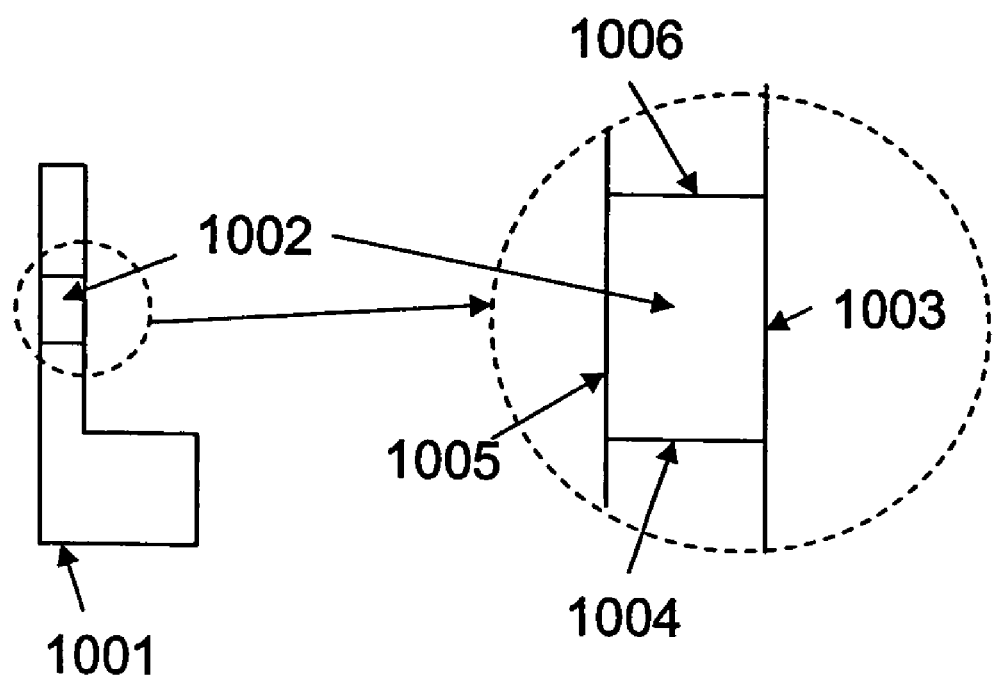
FIG. 10 illustrates the notion of shape and the associated edges for use in phase-shifting mask.

The conversion of the data for phase-shifting mask can also be handled using the concept of shapes. In this case, only edges of the shapes resulting in printing edges will be important. Additional information can be used if two edges of a given shape result in the printing of opposite edges of a feature that need to be phase-shifted. FIG. 10 describes how the shapes can be used for phase-shifting the layout. A shape 1002 is shown in polygon 1001. A magnified view of the shape is given on the right side of FIG. 10. As for FIG. 10, the shape can be decomposed in two types of edges, edges that will create a printed edge on the wafer (1003 and 1005) and edges that will not create a printed edge on the wafer (1004, 1006). For a phase-shifting mask, edge 1003 and 1005 are adjacent to a shifter region. To create the desired phase-shifting effect, the shifter region adjacent to edge 1003 should be out of phase of the shifter region adjacent to edge 1005. The information about the edges 1003 and 1005 can be stored and later on used to assign the phase of the phase-shifting regions.

Figure 11:
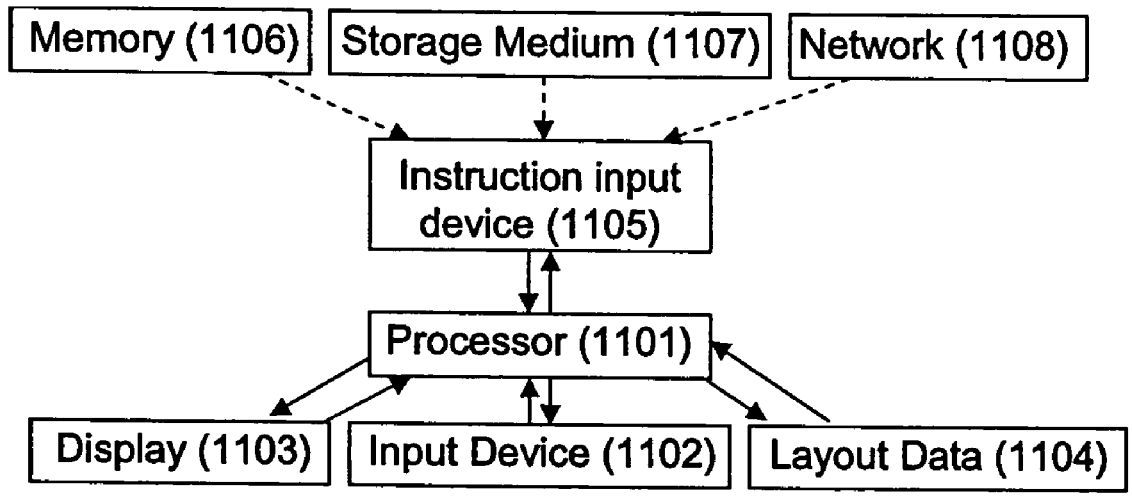
FIG. 11 is a block diagram of a computer system adapted for fracturing, proximity effect correction, and verification according to the present invention.

FIG. 11 illustrates a computer system that can be used to fracture the data, applying OPC and verifying the data. This computer system represents a wide variety of computer systems and computer architectures suitable for this application.

A processor 1101 is connected to receive data indicating user signals from user input device 1102 and to provide data defining images to display 1103. Processor 1101 is also connected for accessing mask layout data 1104, which define a mask layout under construction and a layout for a layer of material to be exposed using the mask. Processor 1101 is also connected for receiving instruction data from instruction input device 1105, which can provide instructions received from connections to memory 1106, storage medium access device 1107, or network 1108.

Figure 12:
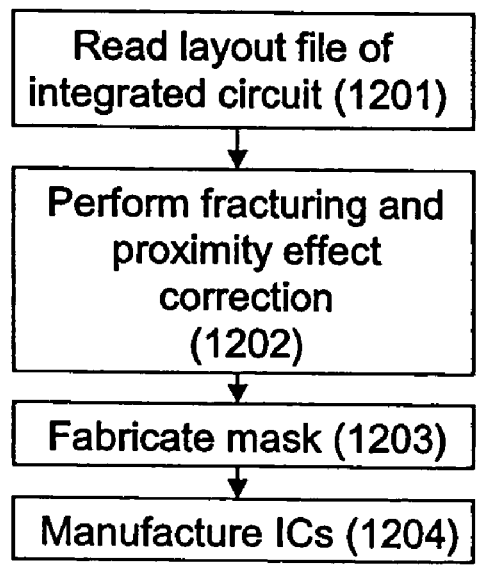
FIG. 12 is a flow chart for a process of integrated circuit manufacturing according to the present invention.

FIG. 12 illustrates the manufacturing process of an IC (Integrated Circuit). At step 1201, the layout file of the integrated circuit is first read using a computer system described in FIG. 11. At step 1202, the layout is fractured and then corrected for proximity effect. The data resulting from step 1202 is used to create a mask at step 1203, and the mask is finally used in the fabrication process of an IC at step 1204.

The technique described above can also be used to directly create an image on the wafer using tools referred to as "direct-write" tools. The direct-write tool could be an optical tool, an e-beam tool, or and EUV tool. In this case the OPC step would be replaced by a step including the correction of the proximity effects created by the direct write tool.

CONCLUSION

The data structures and code described in this description can be stored on a computer readable storage medium, which may be any device or medium that can store code and/or data for use by a computer system. This includes, but is not limited to, magnetic and optical storage devices such as disk drives, magnetic tapes, CD (compact discs) and DVD (digital video disks), and computer instruction signals embodied in a transmission medium. For example, the transmission medium may include a communication network, such as the Internet.

The invention can be applied to any binary masks, rim phase-shifting masks, chromeless phase-shifting masks, attenuated phase-shifting masks, alternating aperture phase-shifting masks used in single or multiple exposure methodologies.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for performing proximity effect correction on a layout of an integrated circuit defined by a computer readable layout file, to produce a corrected layout file, the method comprising:

receiving a polygon from the computer readable layout file, the polygon corresponding to a portion of the integrated circuit and having a given size;

performing using a data processor a fragmentation of the polygon into a set of smaller shapes, based upon parameters of a manufacturing tool used for producing the integrated circuit, wherein said manufacturing tool is distinct from said data processor, and wherein the parameters are associated to characteristics of the manufacturing tool and not associated to dimensions of the polygon;

performing using a data processor a proximity effect correction of at least one of the smaller shapes in the set of smaller shapes to provide a computer readable corrected layout file comprising a modified set of smaller shapes; and providing the computer readable corrected layout file to said manufacturing tool.

2. The method of claim 1, wherein the manufacturing tool comprises a mask writer.

3. The method of claim 1, wherein the manufacturing tool comprises a vector scan, e-beam tool, and said parameters comprise scanning dimensions of said vector scan, e-beam tool.

4. The method of claim 1, wherein one of said parameters is a minimum dimension for the manufacturing tool, and the fragmentation is such that the smaller shapes do not have a dimension smaller than said minimum dimension after said proximity effect correction.

5. The method of claim 1, wherein one of said parameters is a maximum dimension for the manufacturing tool, and the fragmentation is such that the smaller shapes do not have a dimension larger than said maximum dimension after said proximity effect correction.

6. The method of claim 1, wherein the corrected layout file is used to make a binary mask.

7. The method of claim 1, wherein the corrected layout file is used to make an attenuated phase-shifting mask.

8. The method of claim 1, wherein the corrected layout file is used to make a tri-tone phase-shifting mask.

9. The method of claim 1, wherein the corrected layout file is used to make an alternating aperture phase-shifting mask.

10. The method of claim 9, wherein two edges of one of the shapes in the set of smaller shapes are adjacent to two distinct phase-shifting regions, the two phase-shifting regions are substantially out of phase, and including storing information indicating that said two edges of one of the shapes in the set of smaller shapes are adjacent to two distinct phase-shifting regions.

11. The method of claim 10, wherein said information about the two edges is used to facilitate the phase assignment of the phase-shifting regions.

12. The method of claim 1, wherein at least one edge of one shape abuts a boundary of a critical area of the layout.

13. The method of claim 1, wherein the manufacturing tool comprises a mask inspection tool.

14. The method of claim 1, wherein a second polygon within proximity range of the polygon is taken into account in the fragmentation of the shapes.

15. The method of claim 14, wherein a corner of the second polygon is used in the fragmentation of the shapes.

16. A mask for defining a layer of material, said mask comprising:

a mask substrate;

a layout data file used to create a layout pattern on the mask substrate;

said layout pattern comprising material or physical shapes for transfer of an image to a workpiece;

and said layout pattern having at least one shape having at least one segment corrected for proximity effects, said such shape was defined before correction by fragmenting a polygon of the layout data file, based upon parameters of a manufacturing tool used for producing the mask, wherein the parameters are associated to characteristics of the manufacturing tool and not associated to dimensions of the polygon.

17. A method for manufacturing integrated circuits, said integrated circuits being defined by a computer readable layout file, the method comprising:

receiving a polygon from the computer readable layout file, the polygon corresponding to a portion of an integrated circuit and having a given size;

performing using a data processor a fragmentation of the polygon into a set of smaller shapes, based upon parameters of a manufacturing tool used for producing the integrated circuit, wherein said manufacturing toll is distinct from said data processor, and wherein the parameters are associated to characteristics of the manufacturing tool and not associated to dimensions of the polygon;

performing using a data processor a proximity effect correction of at least one of the smaller shapes in the set of smaller shapes to provide a computer readable corrected layout file comprising a modified set of smaller shapes;

providing the computer readable corrected layout file to said manufacturing tool;

producing a mask having a mask layout based on the corrected layout file; and exposing a semiconductor treated with a material sensitive to radiation energy to said radiation energy using said mask.

18. The method of claim 17, wherein the mask is produced using a vector scan, e-beam tool by exposing a mask blank coated with an e-beam sensitive resist and said resist polarity is chosen such that the shapes representing the critical dimensions of the layout are exposed on the mask.

19. A method for producing a mask for a layer on an integrated circuit represented by a computer readable layout file, comprising:

receiving a polygon from the computer readable layout file, the polygon corresponding to a portion of the integrated circuit and having a given size;

performing using a data processor a fragmentation of the polygon into a set of smaller shapes, based upon parameters of a manufacturing tool used for producing the integrated circuit, wherein said manufacturing tool is distinct from said data processor, and wherein the parameters are associated to characteristics of the manufacturing tool and not associated to dimensions of the polygon;

performing using a data processor a proximity effect correction of at least one of the smaller shapes in the set of smaller shapes to provide a computer readable corrected layout file comprising a modified set of smaller shapes; and producing a mask having a mask layout based on the corrected layout file.

20. A system for producing layout data, comprising:

a data processor which executes programs of instruction;

memory accessible by the data processor and storing the programs of instruction, the programs of instruction including logic to receive a polygon of a computer readable layout file of a portion of an integrated circuit and having a given size, performing using a data processor a fragmentation of the polygon into a set of smaller shapes, based upon parameters of a manufacturing tool used for producing the integrated circuit, wherein said manufacturing tool is distinct from said data processor, and wherein the parameters are associated to characteristics of the manufacturing tool and not associated to dimensions of the polygon, and performing using a data processor a proximity effect correction of at least one of the smaller shapes in the set of smaller shapes to provide a computer readable corrected layout file comprising a modified set of smaller shapes.

21. A program of instructions to be executed by a data processor, including logic to receive a polygon of a computer readable layout file of a portion of an integrated circuit and having a given size, logic to perform a fragmentation of the polygon into a set of smaller shapes, based upon parameters of a manufacturing tool used for producing the integrated circuit, wherein said manufacturing tool is distinct from said data processor, and wherein the parameters are associated to characteristics of the manufacturing tool and not associated to dimensions of the polygon, and logic to perform a proximity effect correction of at least one of the smaller shapes in the set of smaller shapes to provide a computer readable corrected layout file comprising a modified set of smaller shapes.

22. A method for performing proximity effect correction on a layout of an integrated circuit defined by a computer readable layout file, to produce a corrected layout file, the method comprising:

receiving a polygon from the computer readable layout file, the polygon corresponding to a portion of the integrated circuit and having a given size;

performing using a data processor a fragmentation of at least one edge of the polygon into a set of segments, based upon parameters of a manufacturing tool used for producing the integrated circuit, wherein said manufacturing tool is distinct from said data processor, and wherein the parameters are associated to characteristics of the manufacturing tool and not associated to dimensions of the polygon;

performing using a data processor a proximity effect correction of at least one of the segments in the set of segments to provide a computer readable corrected layout file; and providing the computer readable corrected layout file to said manufacturing tool.

23. A method for manufacturing integrated circuits, said integrated circuits being defined by a layout file, the method comprising:

receiving a polygon from the computer readable layout file, the polygon corresponding to a portion of an integrated circuit and having a given size;

performing using a data processor a fragmentation of at least one edge of the polygon into a set of segments, based upon parameters of a manufacturing tool used for implementing the integrated circuit, wherein said manufacturing tool is distinct from said data processor, and wherein the parameters are associated to characteristics of the manufacturing tool and not associated to dimensions of the polygon;

performing using a data processor a proximity effect correction of at least one of the segments in the set of segments to provide a computer readable corrected layout file;

producing a mask having a mask layout based on the corrected layout file; and exposing a semiconductor treated with a material sensitive to radiation energy to said radiation energy using said mask.

24. The method of claim 23, where the mask is produced using a vector-scan e-beam tool by exposing a mask blank coated with an e-beam sensitive resist and said resist polarity is chosen such that the shapes representing the critical dimensions of the layout are exposed on the mask.

* * * * *